(12) United States Patent
Drouin

(10) Patent No.: US 11,309,399 B2
(45) Date of Patent: Apr. 19, 2022

(54) PROCESS FOR PREPARING A THIN LAYER OF FERROELECTRIC MATERIAL

(71) Applicant: Soitec, Bernin (FR)

(72) Inventor: Alexis Drouin, La Buissiere (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/980,310

(22) PCT Filed: Feb. 18, 2019

(86) PCT No.: PCT/FR2019/050356
§ 371 (c)(1),
(2) Date: Sep. 11, 2020

(87) PCT Pub. No.: WO2019/175487
PCT Pub. Date: Sep. 19, 2019

(65) Prior Publication Data
US 2021/0036124 A1 Feb. 4, 2021

(30) Foreign Application Priority Data
Mar. 12, 2018 (FR) ...................................... 1852122

(51) Int. Cl.
*H01L 21/00* (2006.01)
*H01L 21/02* (2006.01)
(Continued)

(52) U.S. Cl.
CPC ...... *H01L 29/516* (2013.01); *H01L 21/02002* (2013.01); *H01L 21/76254* (2013.01)

(58) Field of Classification Search
CPC ................................................ H01L 21/76254
(Continued)

(56) References Cited

U.S. PATENT DOCUMENTS 6,146,979 A * 11/2000 Henley ................. B81C 1/0038
438/458
6,251,754 B1 * 6/2001 Ohshima ........... H01L 21/76254
257/E21.568
(Continued)

FOREIGN PATENT DOCUMENTS

FR 2863771 B1 3/2007
FR 2914492 A1 10/2008

OTHER PUBLICATIONS

International Search Report for International Application No. PCT/FR2019/050356 dated Apr. 10, 2019, 2 pages.
(Continued)

*Primary Examiner* — Calvin Lee
(74) *Attorney, Agent, or Firm* — TraskBritt

(57) ABSTRACT

A process for preparing a thin layer made of ferroelectric material based on alkali metal, exhibiting a determined Curie temperature, transferred from a donor substrate to a carrier substrate by using a transfer technique including implanting light species into the donor substrate in order to produce an embrittlement plane, the thin layer having a first, free face and a second face that is arranged on the carrier substrate. The process comprises a first heat treatment of the transferred thin layer at a temperature higher than the Curie temperature, the thin layer exhibiting a multi-domain character upon completion of the first heat treatment, and introducing, after the first heat treatment, protons into the thin layer, followed by applying a second heat treatment of the thin layer at a temperature lower than the Curie temperature to generate an internal electric field that results in the thin layer being made single domain.

20 Claims, 1 Drawing Sheet

(51) Int. Cl.
*H01L 29/51* (2006.01)
*H01L 21/762* (2006.01)

(58) Field of Classification Search
USPC .......... 257/607–612; 438/550, 660, 795–799
See application file for complete search history.

(56) References Cited

U.S. PATENT DOCUMENTS

| | | | | |
|---|---|---|---|---|
| 7,928,317 | B2* | 4/2011 | Atanackovic | H01L 31/06 |
| | | | | 136/252 |
| 8,546,238 | B2* | 10/2013 | Tauzin | H01L 21/76254 |
| | | | | 438/409 |
| 9,242,444 | B2* | 1/2016 | Faure | H01L 21/76254 |
| 2010/0088868 | A1 | 4/2010 | Kando et al. | |

OTHER PUBLICATIONS

International Written Opinion for International Application No. PCT/FR2019/050356 dated Apr. 10, 2019, 5 pages.
Huang et al., Discussion of Domain Inversion in LiNbO3; Applied Physics Letters; vol. 65; No. 14; (1994); 4 pages.
Nakamura et al., Single-domain Surface Layers Formed by Heat Treatment of Proton-exchanged Multi-domain LiTaO3 Crystals; Applied Physics Letters; vol. 63; No. 15; (1993); 3 pages.

* cited by examiner

PROCESS FOR PREPARING A THIN LAYER OF FERROELECTRIC MATERIAL

CROSS-REFERENCE TO RELATED APPLICATIONS

This application is a national phase entry under 35 U.S.C. § 371 of International Patent Application PCT/FR2019/050356, filed Feb. 18, 2019, designating the United States of America and published as International Patent Publication WO 2019/175487 A1 on Sep. 19, 2019, which claims the benefit under Article 8 of the Patent Cooperation Treaty to French Patent Application Serial No. 1852122, filed Mar. 12, 2018.

TECHNICAL FIELD

The present disclosure relates to a process for preparing a thin layer of ferroelectric material based on alkali metal. More particularly, the disclosure relates to a preparation process that makes it possible to maintain or establish the single-domain character of the ferroelectric material in the thin layer of the final product. This preparation process is used, for example, for applications in the fields of microelectronics, micromechanics, photonics, etc.

BACKGROUND

A ferroelectric material is a material that possesses an electrical polarization in the natural state, it being possible for this polarization to be reversed by applying an external electric field. The ferroelectric domain refers to each continuous region of the material in which the polarization is uniform (all the dipole moments are aligned parallel to each other in a given direction).

A ferroelectric material may thus be characterized as "single domain" in the case where this material consists of a single region in which the polarization is uniform or "multidomain" in the case where the ferroelectric material comprises a plurality of regions having polarities that may be different.

Various processes for forming a thin layer of ferroelectric material are known from the prior art. Such processes may be, for example, molecular beam epitaxy, plasma sputtering, plasma deposition (laser-pulsed deposition) or application of the SMART CUT® technology in which a thin layer is transferred from a bulk substrate made of ferroelectric material by splitting at a fragile zone (or embrittlement plane) formed in the bulk substrate by implantation of light species.

The present disclosure relates more particularly to the preparation of a ferroelectric thin layer based on alkali metal obtained by applying such a process.

According to this process, and after the step of transferring a layer, it is often necessary to apply treatments to the thin layer in order to improve its surface state, its crystal quality, its adhesion to a carrier, or to modify its thickness.

It is a known practice to use, after the step of transferring a layer, a heat treatment step in order to improve the above-mentioned properties of the thin layer. Thus, document FR 2863771 teaches a process for preparing a thin layer that consists mainly of two steps: a step of preparing the surface of the thin layer (such as polishing, for example) and a heat treatment step (such as thermal annealing, for example).

In order to better improve the properties of the thin layer, as well as its properties of adhesion with a carrier, it is necessary to perform a heat treatment at a sufficiently high temperature, the aforementioned properties of the thin layer improving more the higher the temperature of the treatment. However, in order to obtain a satisfactory result, this very often means exceeding the Curie temperature of the material.

To recall, the Curie temperature is the temperature beyond which the material loses its ferroelectric properties. When it falls back below the Curie temperature as it cools, the material regains ferroelectric properties. However, the regained ferroelectric properties are generally different from the initial ones and this may result, in particular, in the formation of a plurality of ferroelectric domains within the thin layer, thus giving it a multi-domain character.

This multi-domain character of the ferroelectric material is problematic, since it makes the characteristics of the material inhomogeneous, which may affect the performance of the devices that are to be formed on/in the thin layer. This is particularly the case for surface acoustic wave (SAW) devices, the propagation of the waves being affected by the polarity of the piezoelectric material through which they pass.

This is why it is generally not recommended to expose a layer made of ferroelectric material to a temperature that exceeds its Curie temperature.

Document FR2914492 teaches a process for producing a thin layer of ferroelectric material using the SMART CUT® technique. This document applies an electric field to the thin layer so as to improve or restore its ferroelectric properties. However, to be applied easily, this process requires having electrodes on each of the faces of the thin layer, which is not always the case.

BRIEF SUMMARY

One embodiment of the disclosure provides a process for preparing a thin layer of ferroelectric material that is based on alkali metal and is single domain.

A process is disclosed herein for preparing a thin layer made of ferroelectric material based on alkali metal, exhibiting a determined Curie temperature, transferred from a donor substrate to a carrier substrate using a transfer technique including implanting atomic species into the donor substrate in order to produce an embrittlement plane, the thin layer having a first, free face and a second face that is arranged on the carrier substrate.

According to the disclosure, the process for preparing the thin layer comprises a first heat treatment of the transferred thin layer at a temperature higher than the determined Curie temperature, the thin layer exhibiting a multi-domain character upon completion of the first heat treatment. The process also comprises introducing, after the first heat treatment, protons into the thin layer, followed by applying a second heat treatment of the thin layer at a temperature lower than the determined Curie temperature in order to generate an internal electric field that results in the thin layer being made single domain.

According to other advantageous and non-limiting features of the disclosure, considered alone or according to any technically feasible combination:
 the implanted atomic species are hydrogen ions and/or helium ions;
 the transfer technique includes joining the donor substrate to the carrier substrate and detaching the thin layer at the level of the embrittlement plane;
 the introduction of protons into the thin layer is achieved by means of proton exchange;

the proton exchange is carried out by immersing at least the thin layer in a bath of benzoic acid at a temperature typically between 200 and 300° C. for 10 minutes to 30 hours;

the introduction of the protons into the thin layer is achieved by means of ion implantation or by means of plasma implantation;

the first heat treatment is carried out for a duration of between 30 minutes and 10 hours;

the first and the second heat treatments are carried out under an oxidizing or neutral atmosphere;

the second heat treatment is carried out at a temperature less than 100° C., preferably less than 50° C., or less than 10° C. from the determined Curie temperature and for a duration of between 30 minutes and 10 hours;

the process for preparing the thin layer comprises a polishing step applied to the first face of the thin layer;

the polishing is carried out after the first heat treatment;

the polishing is carried out after the second heat treatment;

the polishing is chemical-mechanical polishing;

the donor substrate is made of an alkali metal ferroelectric material based on lithium;

the donor substrate is made of $LiTaO_3$ or of $LiNbO_3$;

the ferroelectric material exhibits a 42°RY crystal orientation;

the material of the carrier substrate is silicon.

BRIEF DESCRIPTION OF THE DRAWINGS

Other features and advantages of the disclosure will become apparent from the following detailed description of example embodiments, which description is given with reference to the accompanying drawings, in which.

DETAILED DESCRIPTION

For the sake of keeping the following description simple, the same references are used for identical elements or for elements performing the same function in the various presented embodiments of the process.

The figures are schematic representations which, for the sake of legibility, are not to scale. In particular, the thicknesses of the layers are not to scale with respect to the lateral dimensions of these layers.

The term "coefficient of thermal expansion" used in the rest of this description in relation to a layer or a substrate makes reference to the coefficient of expansion in a defined direction in the main plane defining this layer or this substrate. If the material is anisotropic, the coefficient value retained will be that of largest amplitude. The coefficient value is that measured at room temperature.

The disclosure describes a process for preparing a thin layer 3 made of a ferroelectric material based on alkali metal, the layer exhibiting a determined Curie temperature, transferred from a donor substrate 1 to a carrier substrate 7 using a transfer technique including implanting light species into the donor substrate 1. There are several embodiments regarding how this transfer may be carried out.

According to a first embodiment shown in FIGS. 1A to 1D, the donor substrate 1 is composed of a single-domain bulk block of ferroelectric material based on alkali metal such as $KTiOPO_4$, $KNbO_3$, $NaNbO_3$, $KTaO_3$, $NaTaO_3$ and, more particularly, those based on lithium, for example, $LiTaO_3$ (with a Curie temperature typically between 600° C. and 650° C.) and $LiNbO_3$ (with a Curie temperature of about 1145° C.). It is entirely possible to envisage, in the context of the present disclosure, the donor substrate 1 exhibiting a multi-domain character.

The donor substrate 1 may take the form of a circular wafer of standardized size, for example, of 150 mm or 200 mm in diameter. However, the disclosure is not in any way limited to these dimensions or to this form. The donor substrate 1 may have been taken from an ingot of ferroelectric materials in such a way as to form the donor substrate 1 having a predetermined crystal orientation. The orientation is chosen according to the intended application. Thus, it is common practice to choose a 42° RY orientation in the case where it is desired to use the properties of the thin layer to form an SAW filter. However, the disclosure is not in any way limited to a particular crystal orientation.

Whatever the crystal orientation of the donor substrate 1, the process comprises introducing, into the donor substrate 1, at least one atomic species. This introduction may correspond to an implantation, i.e., ion bombardment of the planar face 4 of the donor substrate 1 with species such as hydrogen and/or helium ions.

Figure 1:
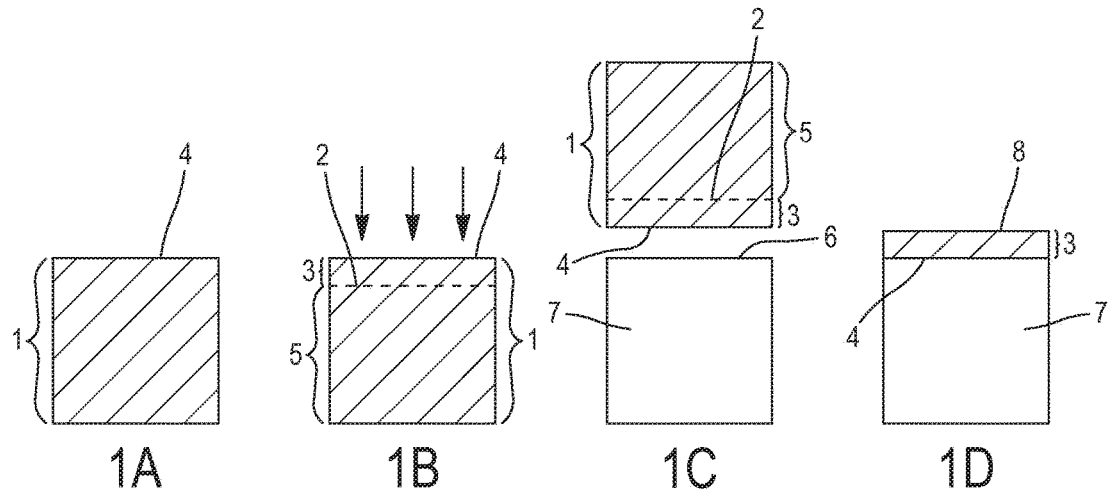
FIGS. 1A to 1D show a first embodiment of a process in accordance with the disclosure.

In a manner known per se, and as is shown in FIG. 1B, the implanted ions have the role of forming an embrittlement plane 2 delimiting a thin layer 3 of ferroelectric material to be transferred, which is located on the planar face 4 side, and another portion 5 forming the rest of the substrate.

The nature, the dose of the implanted species, and the implantation energy are chosen according to the thickness of the layer that it is desired to transfer and of the physicochemical properties of the donor substrate. In the case of a donor substrate 1 made of $LiTaO_3$, it may thus be chosen to implant a dose of hydrogen of between 1E16 and 5E17 $at/cm^2$ with an energy of between 30 and 300 keV to delimit a thin layer 3 of the order of 200 to 2000 nm.

In a following step, shown in FIG. 1C, the planar face 4 of the donor substrate 1 is joined to one planar face 6 of a carrier substrate 7. The carrier substrate 7 may have the same dimensions and the same shape as those of the donor substrate. For reasons of availability and cost, the carrier substrate 7 is a monocrystalline or polycrystalline silicon wafer. However, more generally, the carrier substrate 7 may consist of any material, for example, silicon, sapphire or glass, and may have any shape.

When the process is implemented with a view to producing devices for applications in the radiofrequency area, it may be advantageous to choose a carrier substrate 7 that is highly resistive, exhibiting, for example, a resistivity higher than 1000 ohm·cm. It is also possible to have a charge-trapping layer, such as a layer of polycrystalline silicon a few microns thick, for example, on the carrier substrate 7.

Prior to this joining step, it may be envisaged to prepare the faces of the substrates to be joined via a step of cleaning, brushing, drying, polishing or plasma activation.

The joining step may correspond to placing the donor substrate 1 in intimate contact with the carrier substrate 7 by molecular adhesion and/or electrostatic bonding. Optionally, to facilitate the joining of the two substrates 1, 7 notably when they are joined by direct bonding, at least one intermediate layer may be formed prior to the joining, either on the planar face 4 of the donor substrate 1, or on the planar face 6 of the carrier substrate 7 to be joined, or on both. This intermediate layer consists, for example, of silicon oxide, silicon nitride or polycrystalline silicon and has a thickness of between a few nanometers and a few microns. The intermediate layer may be produced according to the various techniques known from the prior art, such as oxidation or nitridation heat treatments, chemical depositions (PECVD, LPCVD, etc.), etc. This intermediate layer, when it is polycrystalline, is configured, in terms of thickness, for example, to retain its polycrystalline properties upon completion of the various heat treatments of the preparation process.

Upon completion of this joining step, the assembly shown in FIG. 1C is obtained, comprising the two associated substrates, the planar face 6 of the carrier substrate 7 adhering to the planar face 4 of the donor substrate 1.

The assembly is then treated to detach the thin layer 3 of ferroelectric material from the donor substrate 1, for example, by cleavage at the level of the embrittlement plane 2.

This detachment step may thus comprise the application of a heat treatment in a temperature range of the order of 80° C. to about 300° C. to allow the transfer of the thin layer 3 to the carrier substrate 7. Instead of or in addition to the heat treatment, this step may comprise the application of a blade, jet of gaseous or liquid fluid, or more generally any mechanical force to the embrittlement plane 2.

Following the detachment step, the structure 9 shown in FIG. 1D is obtained. This structure 9 comprises the thin layer 3 of ferroelectric material comprising a first, free face 8 and a second planar face 4 arranged on the carrier substrate 7. The thin layer 3 may equally exhibit a single-domain or multi-domain character.

FIGS. 2A to 2D show a second embodiment of the structure 9, particularly suitable for producing a heterogeneous structure 9, in which the thin layer 3 exhibits a coefficient of thermal expansion that is quite different from that of the carrier substrate 7, for example, exhibiting a difference of more than 10%.

Figure 2:
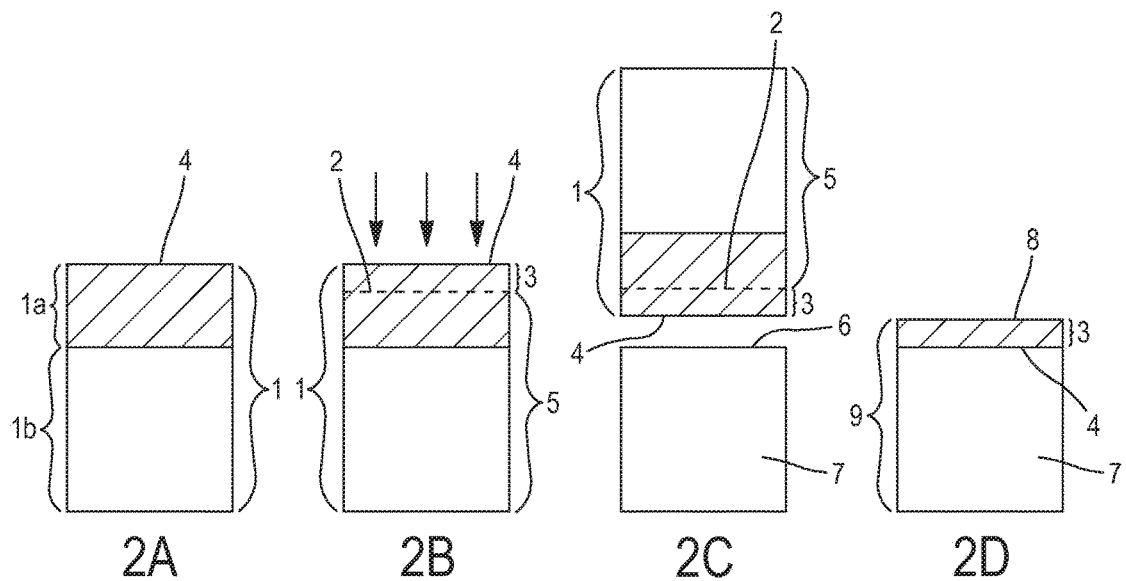
FIGS. 2A to 2D show a second embodiment of a process in accordance with the disclosure.

With reference to FIG. 2A, the donor substrate 1 is, in this case, composed of a thick layer of ferroelectric material 1*a* based on alkali metal, possessing the same properties as those described for the bulk block of ferroelectric material in relation to the first embodiment, and of a handling substrate 1*b*.

The handling substrate 1*b* advantageously consists of a material (or of a plurality of materials) giving it a coefficient of thermal expansion close to that of which the carrier substrate 7 is composed. The term "close" means that the difference in coefficient of thermal expansion of the handling substrate 1*b* and of that of the carrier substrate 7 is less, as an absolute value, than the difference in thermal expansion of the bulk block of ferroelectric material and of that of the carrier substrate 7.

Preferentially, the handling substrate 1*b* and the carrier substrate 7 have an identical coefficient of thermal expansion. When joining the donor substrate and the carrier substrate, a structure capable of withstanding a heat treatment at a relatively high temperature is formed, which temperature may even exceed the Curie temperature of the thick layer of ferroelectric material 1*a* based on alkali metal. For the sake of ease of implementation, this may be obtained by selecting the handling substrate 1*b* so that it consists of the same material as that of the carrier substrate 7.

To form the donor substrate 1 of this embodiment, a bulk block of ferroelectric material is joined to the handling substrate 1*b* beforehand, for example, by means of a molecular adhesive bonding technique such as has been described previously. Next, the layer of ferroelectric material 1*a* is formed by thinning, for example, by milling and/or chemical-mechanical polishing and/or etching. Before joining, the formation of an adhesion layer (for example, by deposition of silicon oxide and/or silicon nitride) on one and/or another of the faces placed in contact may have been envisaged. The joining may comprise the application of a low-temperature heat treatment (for example, between 50° C. and 300° C., typically 100° C.) making it possible to strengthen the bonding energy sufficiently to allow the following step of thinning.

The handling substrate 1*b* is chosen to have a thickness substantially equivalent to that of the carrier substrate 7. The thinning step is performed such that the thick layer 1*a* has a thickness that is low enough for the stresses generated during the heat treatments applied in the rest of the process to be of reduced intensity. At the same time, this thickness is high enough to be able to take the thin layer 3 or a plurality of such layers therefrom. This thickness may be, for example, between 5 and 400 microns.

The following steps of the process of this second implementation are equivalent to those of the steps described in the first embodiment. Atomic species are implanted within the thick layer of ferroelectric material 1*a* in order to produce an embrittlement plane 2, which demarcates the separation of the thin layer 3 from the remaining portion 5 of the donor substrate 1, as shown in FIG. 2B. This step is followed by a step of joining the donor substrate 1 to the carrier substrate 7, as shown in FIG. 2C. Next, the thin layer 3 is detached from the rest of the remaining portion 5 of the donor substrate 1 in order to obtain the structure 9 shown in FIG. 2D.

This embodiment is advantageous in that the assembly formed of the donor substrate 1 and of the carrier substrate 7 may be exposed to a temperature substantially higher than that applied in the context of the first embodiment, without risking the uncontrolled splitting of one of the substrates or the delamination of the donor substrate 1 from the thin layer 3. The balanced structure, in terms of coefficient of thermal expansion of this assembly, thus makes it possible to facilitate the step of detaching the thin layer 3 by exposing the assembly to a relatively high temperature, for example, between 100° C. and 500° C. or more. This temperature may be higher than the Curie temperature of the thin layer 3, since the single-domain character of this thin layer 3 could be re-established in the preparation steps, the description of which follows.

Whichever implementation is chosen, and as specified in the introduction of this patent application, steps of preparing the thin layer 3 are subsequently necessary in order to improve the crystal, surface and adhesion quality of the thin layer 3.

Figure 3:
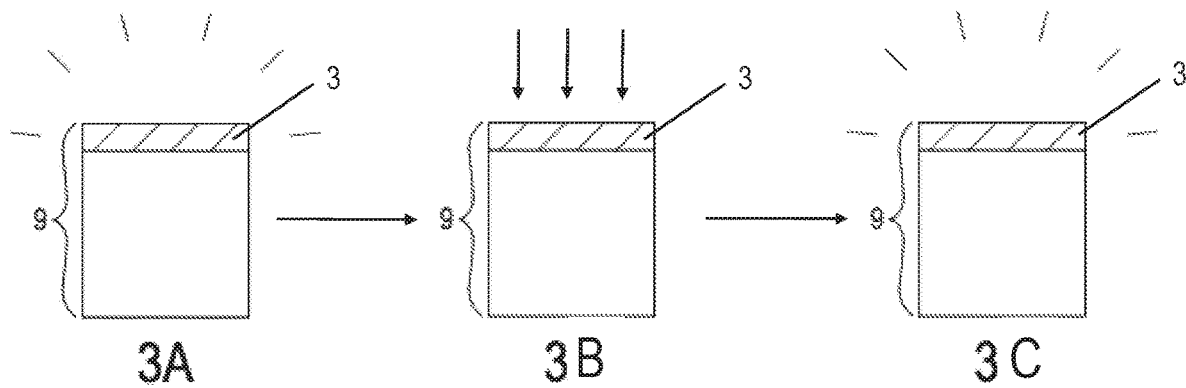
FIGS. 3A to 3C schematically show a process for preparing a thin layer in accordance with the disclosure.

The process for preparing the thin layer 3, illustrated by FIGS. 3A-3C, includes a first heat treatment (FIG. 3A) applied to the transferred thin layer 3. This heat treatment allows crystal defects that may have been generated in the preceding implantation and splitting steps to be corrected. In addition, it contributes towards consolidating the bonding between the thin layer 3 and the carrier substrate 7. According to the present disclosure, this first heat treatment brings the structure to a temperature higher than the Curie temperature of the thin layer 3, while of course not exceeding the melting point of this layer, for a duration typically of between 30 minutes and 10 hours. This heat treatment is preferably carried out by exposing the free face of the thin layer 3 to an oxidizing or neutral gaseous atmosphere, i.e., without covering this face of the thin layer with a protective layer.

This first heat treatment is carried out at a temperature higher than the Curie temperature of the thin layer 3, which then temporarily loses its ferroelectric properties. When the temperature of the thin layer 3 falls back below its Curie temperature as it cools, new ferroelectric properties are obtained. These new ferroelectric properties are generally different from the initial ones and may vary locally, thus giving the thin layer a multi-domain character.

Upon completion of this first heat treatment, the thin layer 3 possesses a multi-domain character. However, the thin layer 3 possesses a better crystal quality and a better degree of adhesion with the carrier substrate 7 than an identical thin layer that has been treated by a first heat treatment carried out at a temperature lower than its Curie temperature.

The purpose of the next step is to re-establish the single-domain character of the thin layer 3. This step includes introducing, after the first heat treatment, protons (FIG. 3B), for example, protons from hydrogen, into the thin layer 3 followed by applying a second heat treatment (FIG. 3C) of the thin layer 3 at a temperature lower than its Curie temperature.

The purpose of introducing protons is to generate a positive charge gradient in the thin layer 3 in order to induce an internal electric field that exceeds the internal coercive field. In this way, the material is oriented in the direction of this internal field in order to make it single domain on the scale of the thin layer 3.

Protons may be introduced in various ways. It may be a proton exchange carried out, for example, by immersing at least the thin layer 3 in a bath of benzoic acid at a temperature typically between 200° C. and 300° C. for 10 minutes to 30 hours.

Protons may also be introduced by means of ion implantation or by means of plasma implantation.

The second heat treatment makes it possible to facilitate the reorientation of the internal electric field by promoting the diffusion of the protons, which results in the charge gradient being improved, and by decreasing the value of the coercive field.

Reference may be made to the documents "Discussion of domain inversion in $LiNbO_3$, L. Huang, N A F Jaeger, Applied physics letters, 1994," and "Single-domain surface layers formed by heat treatment of proton-exchanged multi-domain $LiTaO_3$ crystals, K. Nakamura and A. Tourlog, Applied physics letters, 1993," for more detail on the mechanisms involved in this heat treatment, and reasons why these steps allow a single-domain layer to be provided.

The second heat treatment brings the structure to a temperature lower by less than 100° C., preferably less than 50° C., or less than 10° C. than the Curie temperature of the thin layer 3, preferably for a duration of between 30 minutes and 10 hours. This second heat treatment, just like the first heat treatment, is preferentially performed by exposing the free face of the thin layer 3 to an oxidizing or neutral gaseous atmosphere.

Upon completion of this second heat treatment, the thin layer 3 then exhibits a single-domain character.

The preparation process may also include, just after the first heat treatment or after the second heat treatment, thinning of the thin layer 3. This thinning may correspond to polishing of the first, free face 8 of the thin layer 3, for example, by means of mechanical, chemical-mechanical and/or chemical etching thinning techniques. It makes it possible to prepare the free face 8 so that it has little roughness, for example, less than 0.5 nm RMS 5×5 µm by atomic force measurement (AFM) and to remove a surface portion of the first, free face 8 of the thin layer 3 that is liable to contain residual defects.

Exposing the thin layer to temperatures exceeding its Curie temperature after this second heat treatment will be avoided so as to maintain the single-domain property that has been re-established.

Of course, the present disclosure is not limited to the described embodiments and variants thereof may fall within the scope of the invention such as defined by the claims.

The invention claimed is:

1. A process for preparing a thin layer of ferroelectric material based on alkali metal, exhibiting a Curie temperature, comprising:
   transferring the thin layer of ferroelectric material based on alkali metal from a donor substrate to a carrier substrate using a transfer technique including implanting atomic species into the donor substrate to produce an embrittlement plane delimiting the thin layer, which has a first, free face and a second face that is disposed on the carrier substrate after transferring the thin layer to the carrier substrate, wherein the donor substrate has a coefficient of thermal expansion close to that of the carrier substrate;
   applying a first heat treatment to the transferred thin layer at a temperature higher than the Curie temperature, the thin layer of ferroelectric material based on alkali metal exhibiting a multi-domain character upon completion of the first heat treatment;
   introducing protons into the thin layer after the first heat treatment; and
   after introducing the protons into the thin layer, applying a second heat treatment to the thin layer at a temperature lower than the Curie temperature and generating an internal electric field resulting in the thin layer of ferroelectric material based on alkali metal being made single domain.

2. The process according to claim 1, wherein transferring the thin layer from a donor substrate to a carrier substrate includes joining the donor substrate to the carrier substrate and detaching the thin layer at the level of the embrittlement plane.

3. The process according to claim 1, wherein the introducing of the protons into the thin layer is achieved by way of ion implantation or by way of plasma implantation.

4. The process according to claim 1, wherein each of the first heat treatment and the second heat treatment are carried out under an oxidizing or neutral atmosphere.

5. The process according to claim 1, wherein the first heat treatment is carried out for a duration of between 30 minutes and 10 hours.

6. The process according to claim 1, wherein the thin layer of ferroelectric material exhibits a 42° RY crystal orientation.

7. The process according to claim 1, wherein the carrier substrate comprises silicon.

8. The process according to claim 1, wherein the second heat treatment is carried out at a temperature less than 100° C. from the Curie temperature and for a duration of between 30 minutes and 10 hours.

9. The process according to claim 8, wherein the second heat treatment is carried out at a temperature less than 10° C. from the Curie temperature.

10. The process according to claim 1, wherein the introducing of the protons into the thin layer is achieved by way of proton exchange.

11. The process according to claim 10, wherein the proton exchange is carried out by immersing at least the thin layer in a bath of benzoic acid at a temperature between 200° C. and 300° C. for 10 minutes to 30 hours.

12. The process according to claim 1, wherein the donor substrate comprises a ferroelectric material based on lithium.

13. The process according to claim 12, wherein the donor substrate comprises $LiTaO_3$ or of $LiNbO_3$.

14. The process according to claim 1, further comprising polishing the first, free face of the thin layer.

15. The process according to claim 14, wherein the polishing is carried out after the first heat treatment or after the second heat treatment.

16. The process according to claim 1, wherein the implanted atomic species are hydrogen and/or helium ions.

17. The process according to claim 16, wherein transferring the thin layer from a donor substrate to a carrier substrate includes joining the donor substrate to the carrier substrate and detaching the thin layer at the level of the embrittlement plane.

18. The process according to claim 17, wherein the introducing of the protons into the thin layer is achieved by way of ion implantation or by way of plasma implantation.

19. The process according to claim 17, wherein the introducing of the protons into the thin layer is achieved by way of proton exchange.

20. The process according to claim 19, wherein the proton exchange is carried out by immersing at least the thin layer in a bath of benzoic acid at a temperature between 200° C. and 300° C. for 10 minutes to 30 hours.

* * * * *